(12) United States Patent
Tabei

(10) Patent No.: US 11,451,195 B2
(45) Date of Patent: Sep. 20, 2022

(54) AMPLIFYING APPARATUS

(71) Applicant: Murata Manufacturing Co., Ltd., Kyoto (JP)

(72) Inventor: Makoto Tabei, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/868,842

(22) Filed: May 7, 2020

(65) Prior Publication Data

US 2020/0358407 A1 Nov. 12, 2020

(30) Foreign Application Priority Data

May 8, 2019 (JP) ................... 2019-088464

(51) Int. Cl.
*H03F 1/22* (2006.01)
*H03F 1/34* (2006.01)
*H03F 3/195* (2006.01)
*H03F 1/56* (2006.01)

(52) U.S. Cl.
CPC ............. *H03F 1/342* (2013.01); *H03F 1/565* (2013.01); *H03F 3/195* (2013.01); *H03F 2200/129* (2013.01); *H03F 2200/222* (2013.01); *H03F 2200/294* (2013.01); *H03F 2200/451* (2013.01)

(58) Field of Classification Search
CPC ......................................................... H03F 1/22
USPC .......................................... 330/311, 310, 63
See application file for complete search history.

(56) References Cited

U.S. PATENT DOCUMENTS

| 7,136,764 B2 * | 11/2006 | Adan ....................... H03F 3/189 |
| | | 702/65 |
| 10,276,521 B2 * | 4/2019 | Babcock ................... H03F 1/32 |
| 2018/0226367 A1 | 8/2018 | Babcock et al. |

* cited by examiner

*Primary Examiner* — Henry Choe
(74) *Attorney, Agent, or Firm* — Pearne & Gordon LLP

(57) ABSTRACT

An amplifying apparatus includes a transistor arranged on a substrate and constituting an amplifier, an input terminal for inputting a high-frequency signal to the amplifier, an output terminal for outputting the high-frequency signal amplified by the amplifier, a first inductor formed in or on the substrate and connected between a source of the transistor and a ground, and a second inductor formed in or on the substrate and connected between a gate of the transistor and the input terminal. When the substrate is viewed in a plan view, the first inductor and the second inductor do not overlap each other. The first inductor and the second inductor are magnetically coupled to each other.

20 Claims, 5 Drawing Sheets

AMPLIFYING APPARATUS

This application claims priority from Japanese Patent Application No. 2019-088464 filed on May 8, 2019. The content of this application is incorporated herein by reference in its entirety.

BACKGROUND OF THE DISCLOSURE

1. Field of the Disclosure

The present disclosure relates to an amplifying apparatus.

2. Description of the Related Art

A power amplification module for amplifying a radio frequency transmission signal has been used in various communication devices such as a wireless terminal device (for example, see U.S. Patent Application Publication No. 2018/0226367).

U.S. Patent Application Publication No. 2018/0226367 discloses a low-noise amplification system including an amplifier circuit configured by two amplifiers cascode-connected, and an input matching circuit including a first inductor connected in series to a gate of the amplifier and an inductor connected between the gate of the amplifier and a ground (for example, FIG. 41A in U.S. Patent Application Publication No. 2018/0226367).

A second inductor is connected to a source of the amplifier, and the first inductor and the second inductor are magnetically coupled to each other to provide negative feedback to improve linearity of the low-noise amplification system. The first inductor and the second inductor are arranged so as to overlap (interleave) each other (for example, see FIG. 43 in U.S. Patent Application Publication No. 2018/0226367).

When the inductors constituting a negative feedback circuit are arranged as described above, since the magnetic coupling between the inductors is strong, high linearity is obtained. On the other hand, strong electric coupling also occurs, and thus parasitic capacitance is developed between the gate and source of the amplifier, and the gain of the amplifier circuit greatly decreases. Thus, it is difficult to achieve both gain and linearity required for communication in a relatively high frequency band used in recent years.

BRIEF SUMMARY OF THE DISCLOSURE

Thus, an object of the present disclosure is to provide an amplifying apparatus capable of easily achieving both gain and linearity.

In order to achieve the above object, an amplifying apparatus according to an aspect of the present disclosure includes a transistor arranged on a substrate, and constituting an amplifier, an input terminal for inputting a high-frequency signal to the amplifier, an output terminal for outputting the high-frequency signal amplified by the amplifier, a first inductor formed in or on the substrate and connected between a source of the transistor and a ground, and a second inductor formed in or on the substrate and connected between a gate of the transistor and the input terminal. When the substrate is viewed in a plan view, the first inductor and the second inductor do not overlap each other.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, embodiments of the present disclosure will be described in detail with reference to the accompanying drawings. Note that, the embodiments described below represent general or specific examples. Numerical values, shapes, materials, constituent elements, arrangements and connection forms of the constituent elements, and the like illustrated in the following embodiments are mere examples and are not intended to limit the present disclosure.

In addition, in the following embodiments, a description "connect" means connecting two or more objects or portions of an object to each other directly or with one or more components or circuit elements interposed therebetween. A description "magnetic coupling" and a description "electric coupling" mean electromagnetic coupling in which a magnetic field and an electric field respectively play important roles.

In addition, since the present disclosure focuses on a high-frequency operation of a high-frequency signal amplifier, in particular, of an input unit, a description of a bias circuit and a description of an output unit are omitted in some cases in order to avoid redundancy.

Each of the layout diagrams is intended to convey the gist of the disclosure, and thus, other parts than a main part are omitted in some cases. Further, scales among the layout diagrams are not necessarily the same. A relationship and a ratio of respective thicknesses of lines in the layout diagram are not intended to be strict.

Embodiment 1

An amplifying apparatus according to Embodiment 1 will be described with reference to an example of an amplifying apparatus having negative feedback formed by the magnetic coupling between the inductors.

Figure 1:
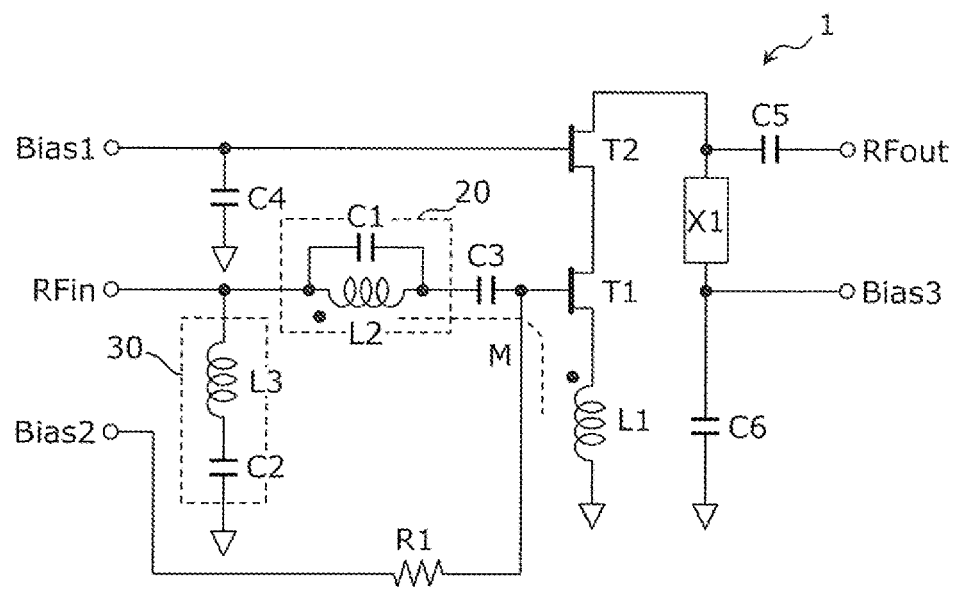
FIG. 1 is a circuit diagram illustrating an example of a circuit configuration of an amplifying apparatus according to Embodiment 1.

FIG. 1 is a circuit diagram illustrating an example of a circuit configuration of the amplifying apparatus according to Embodiment 1. As illustrated in FIG. 1, an amplifying apparatus 1 includes transistors T1, T2, inductors L1, L2, L3, capacitors C1, C2, C3, C4, C5, C6, a reactance element X1, and a resistor R1.

The transistors T1 and T2 constitute, as an example, a cascode amplifier. The transistor T1 is a transistor in a first stage of the cascode amplifier. Note that, the amplifier is not limited to the cascode amplifier. For example, the transistor T1 alone may constitute a source grounded type amplifier.

The inductor L1 is connected between a source of the transistor T1 and a ground (indicated by a small triangle in FIG. 1). By providing the inductor L1, it is possible to provide negative feedback to improve stability, and at the same time, easily achieve input impedance matching of the transistor T1.

The inductor L2 is connected between a gate of the transistor T1 and an input end RFin. By providing the inductor L2, it is possible to, together with other circuit elements, match input impedance of the transistor T1 with characteristic impedance for input/output.

The inductor L1 and the inductor L2 are magnetically coupled to each other so as to form the negative feedback. As will be described later, the inductor L1 and the inductor L2 are formed in or on the same substrate, and thus are magnetically coupled to each other easily. Since the inductor L1 and the inductor L2 are magnetically coupled to each other, gain is suppressed in a frequency with high gain, and gain is equalized over a certain frequency range, so that a gain ripple in a band is suppressed. Further, since linearity of amplification increases due to the negative feedback, amplification distortion decreases, for example, a third order input intercept point IIP3 increases.

Further, since the negative feedback is formed by the magnetic coupling between the inductor L1 and the inductor L2, a loss element such as a resistor unit is not included in a feedback path. Thus, there is no increase in noise figure (NF) as compared to a case in which there is no negative feedback, and the noise figure can be decreased as compared to a case of negative feedback by a resistor.

The capacitor C1 is connected in parallel to the inductor L2. The inductor L2 and the capacitor C1 constitute a resonance circuit 20. A resonant frequency of the resonance circuit 20 is outside a band on a higher side of an operation band of the amplifier constituted by the transistors T1 and T2.

Since the inductor L2 and the capacitor C1 resonate in parallel in the resonance circuit 20, it is possible to reflect an unwanted wave outside the band on a high-frequency side with high impedance to prevent the wave from entering the transistor T1, thereby increasing the attenuation outside the band (higher side).

The capacitor C3 for DC blocking at the gate of the transistor T1 is connected between the resonance circuit 20 and the gate of the transistor T1.

The inductor L3 is connected between the gate of the transistor T1 and the ground. The capacitor C2 is connected in series to the inductor L3. The inductor L3 and the capacitor C2 constitute a resonance circuit 30. A resonant frequency of the resonance circuit 30 is outside a band on a lower side of the operation band of the amplifier constituted by the transistors T1 and T2.

Since the inductor L3 and the capacitor C2 resonate in series in the resonance circuit 30, it is possible to reflect an unwanted wave outside the band on a low-frequency side with a short circuit to prevent the wave from entering the transistor T1, thereby increasing the attenuation outside the band (lower side).

A source of the transistor T2 is connected to a drain of the transistor T1. A gate of the transistor T2 is connected to a first bias end Bias1. The capacitor C4 is connected between the first bias end Bias1 and the ground. The gate of the transistor T1 is connected to a second bias end Bias2 with the resistor R1 interposed therebetween.

The capacitor C5 for DC blocking and matching at a drain of the transistor T2 is connected between the drain of the transistor T2 and an output end RFout. The reactance element X1 for matching the drain of the transistor T2 is connected between the drain of the transistor T2 and the ground. The capacitor C6 is connected between the reactance element X1 and the ground. A node between the reactance element X1 and the capacitor C6 is connected to a third bias end Bias3.

The amplifying apparatus 1 configured as described above amplifies an RF signal supplied to the input end RFin, when the predetermined bias is supplied to the first bias end Bias1, the second bias end Bias2, and the third bias end Bias3, and outputs the amplified RF signal from the output end RFout.

Note that, in the amplifying apparatus according to Embodiment 1, the resonance circuits 20 and 30 are not essential.

Figure 2:
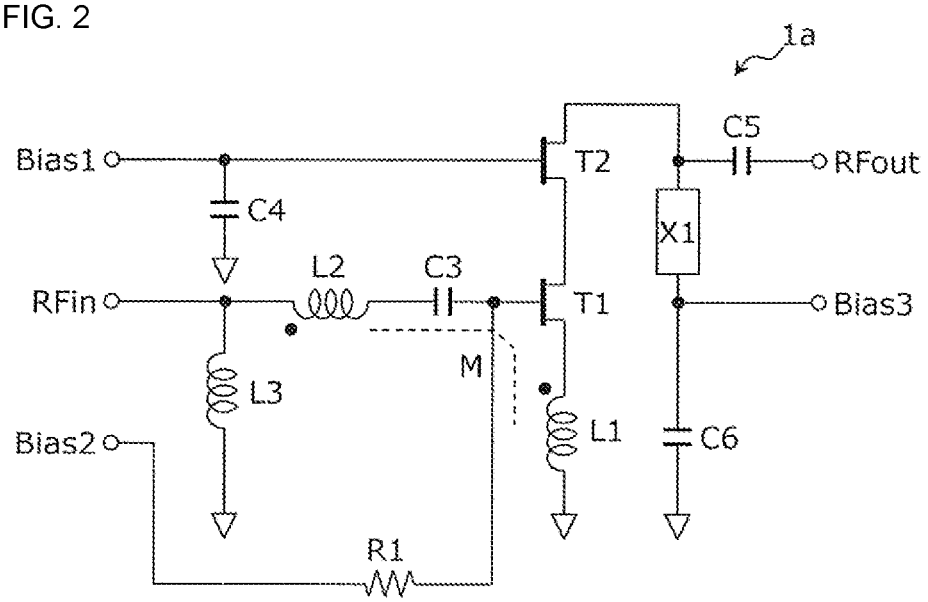
FIG. 2 is a circuit diagram illustrating another example of the circuit configuration of the amplifying apparatus according to Embodiment 1.

FIG. 2 is a circuit diagram illustrating another example of the circuit configuration of the amplifying apparatus according to Embodiment 1. As illustrated in FIG. 2, in an amplifying apparatus 1a, the capacitors C1 and C2 are removed, as compared to the amplifying apparatus 1 in FIG. 1. The amplifying apparatus 1a does not include the resonance circuits 20 and 30 in the amplifying apparatus 1.

The circuit elements of each of the amplifying apparatuses 1 and 1a are formed in or mounted on the substrate.

Figure 3:
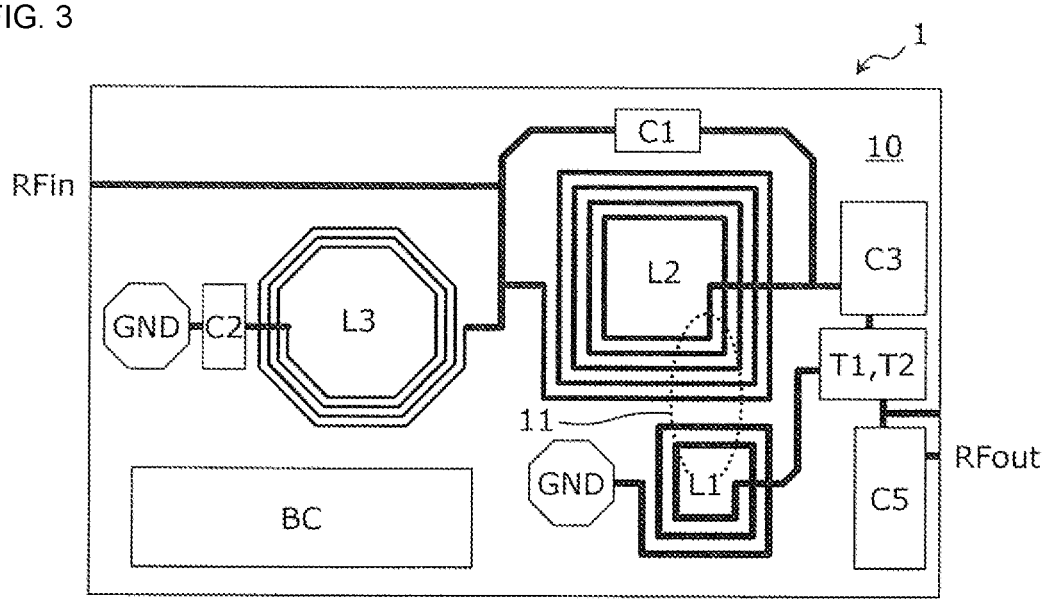
FIG. 3 is a layout diagram illustrating an example of an arrangement of main circuit elements of the amplifying apparatus according to Embodiment 1.

FIG. 3 is a layout diagram illustrating an example of an arrangement of main circuit elements in the amplifying apparatus 1. In FIG. 3, the arrangement of the circuit elements seen in a plan view of a substrate 10 is illustrated, while the same reference signs as those used in FIG. 1 are assigned. Some of the circuit elements illustrated in FIG. 1 are omitted in FIG. 3. Note that, an arrangement of the main circuit elements in the amplifying apparatus 1a is the same as the arrangement of the main circuit elements of the amplifying apparatus 1a illustrated in FIG. 3, except that the capacitors C1 and C2 are removed. Thus, a main part of the description in FIG. 3 also holds true for the amplifying apparatus 1a.

The substrate 10 may be, for example, a multilayer printed-circuit board in which multiple base layers made of a ceramic material or a resin material are laminated, or a semiconductor substrate made of a semiconductor material such as silicon or gallium arsenide. The semiconductor substrate may be a silicon on insulator (SOI) substrate in which an insulating film is formed on a lower layer of a semiconductor material.

The inductors L1, L2, and L3 are constituted by wiring conductors formed in or on the substrate 10. The wiring conductor is constituted by, for example, a metal material containing aluminum, copper, or silver, alloy, or a laminated body of multiple kinds of metal layers. When the substrate 10 is a printed-circuit board, the wiring conductor may be formed of a metal foil formed in an inner layer or on a surface layer of the printed-circuit board, or when the substrate 10 is a semiconductor substrate, the wiring conductor may be formed of a metal film formed on a wiring layer provided on the semiconductor substrate.

Each of the capacitors C1, C2, C3, C4, C5, C6 (C4, C6 are not illustrated in FIG. 3), the transistors T1, T2, and the reactance element X1 (not illustrated in FIG. 3) may be constituted by a predetermined structure formed in or on the substrate 10, or may be constituted by a component separate from the substrate 10 and mounted on the substrate 10.

A ground electrode GND is an electrode for external connection formed on a surface layer of the substrate 10, and corresponds to the ground in FIG. 1.

In the example illustrated in FIG. 3, the inductors L1, L2, and L3 are spiral inductors each constituted by a wiring conductor having a shape continuously spiraled one or more times in a fixed direction. A shape of a rotating trajectory of the wiring conductor constituting the spiral inductor may be spiral in which a diameter changes continuously or intermittently, or may be polygonal spiral in which side lengths change continuously or intermittently. A width of the wiring conductor or a gap between the adjacent wiring conductors may be changed continuously, or, intermittently for each corner or each rotation.

When the substrate 10 is viewed in a plan view, the inductors L1 and L2 do not overlap each other. Similarly, when the substrate 10 is viewed in a plan view, the inductors L1 and L3 do not overlap each other, and the inductors L2 and L3 do not overlap each other.

Here, the description "the two inductors do not overlap each other" means that, when the substrate 10 is viewed in a plan view, in a region surrounded by the wiring conductor located at an outermost periphery among the wiring conductors constituting one conductor, there is no wiring conductor constituting another inductor. The description "the two inductors do not overlap each other" can be rephrased as "the two inductors are arranged so as to be lateral to each other".

A distance between the respective outermost wiring conductors of the inductors L1 and L2 is designed such that the inductors L1 and L2 are magnetically coupled to each other with magnitude suitable for forming the desired negative feedback (a dotted circle 11 in FIG. 3). Since the inductors L1 and L2 are arranged so as not to overlap each other, even when the inductors L1 and L2 are brought close to each other, and somewhat large magnetic coupling is provided between the inductors L1 and L2, electric coupling is unlikely to be large.

Effects of the amplifying apparatuses 1 and 1a configured as described above will be described, based on the comparison with an amplifying apparatus according to a comparative example.

Figure 4:
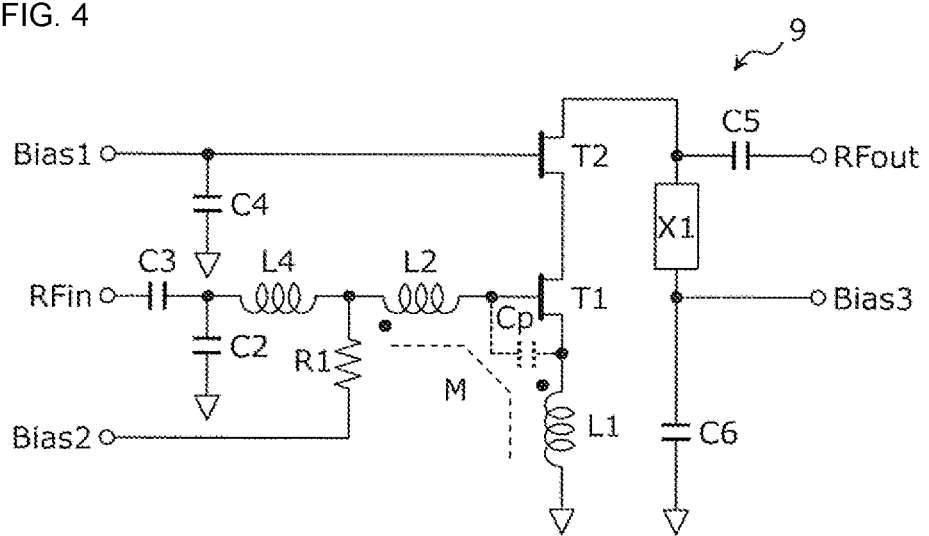
FIG. 4 is a circuit diagram illustrating an example of a circuit configuration of an amplifying apparatus according to a comparative example.

FIG. 4 is a circuit diagram illustrating an example of a circuit configuration of the amplifying apparatus according to the comparative example. As illustrated in FIG. 4, an amplifying apparatus 9 is different from the amplifying apparatus 1 in FIG. 1, in that an inductor L4 is provided instead of the inductor L3, an arrangement of the capacitor C3 is changed, and the capacitor C1 is omitted.

The inductor L4 is connected in series to the inductor L2, between the gate of the transistor T1 and the input end RFin. The capacitor C3 is connected between the input end RFin and the inductor L4. The amplifying apparatus 9 does not include the resonance circuits 20 and 30 in the amplifying apparatus 1.

Figure 5:
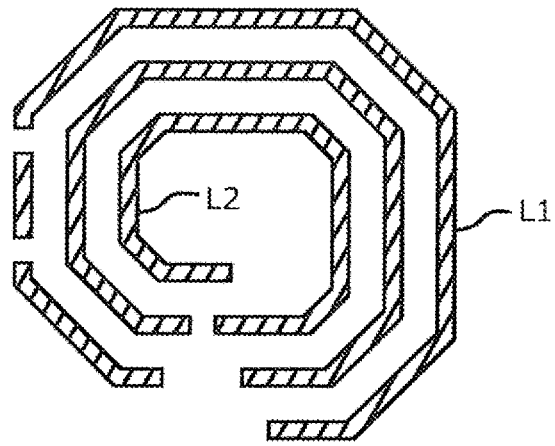
FIG. 5 is a layout diagram illustrating an example of an arrangement of inductors of the amplifying apparatus according to the comparative example.

FIG. 5 is a layout diagram illustrating an example of an arrangement of the inductors L1 and L2 of the amplifying apparatus 9. In the example in FIG. 5, the inductors L1 and L2 of the amplifying apparatus 9 are arranged so as to overlap with each other, as in an arrangement of the first inductor and the second inductor in the low-noise amplification system disclosed in U.S. Patent Application Publication No. 2018/0226367.

The following four kinds of amplifying apparatuses (Examples 1 and 2, and Comparative examples 1 and 2) are set based on the amplifying apparatuses 1, 1a, and 9 described above, and frequency characteristics of gain are obtained for each amplifying apparatus.

Example 1: an amplifying apparatus having the circuit configuration (FIG. 1) of the amplifying apparatus 1, in which the inductors L1 and L2 are arranged so as not to overlap each other (FIG. 3).

Example 2: an amplifying apparatus having the circuit configuration (FIG. 2) of the amplifying apparatus 1a, in which the inductors L1 and L2 are arranged so as not to overlap each other (FIG. 3).

Comparative example 1: an amplifying apparatus having the circuit configuration (FIG. 4) of the amplifying apparatus 9, in which the inductors L1 and L2 are arranged so as to overlap each other (FIG. 5).

Comparative example 2: an amplifying apparatus configured such that the inductors L1 and L2 in the amplifying apparatus of Comparative example 1 are not magnetically coupled to each other.

Figure 6:
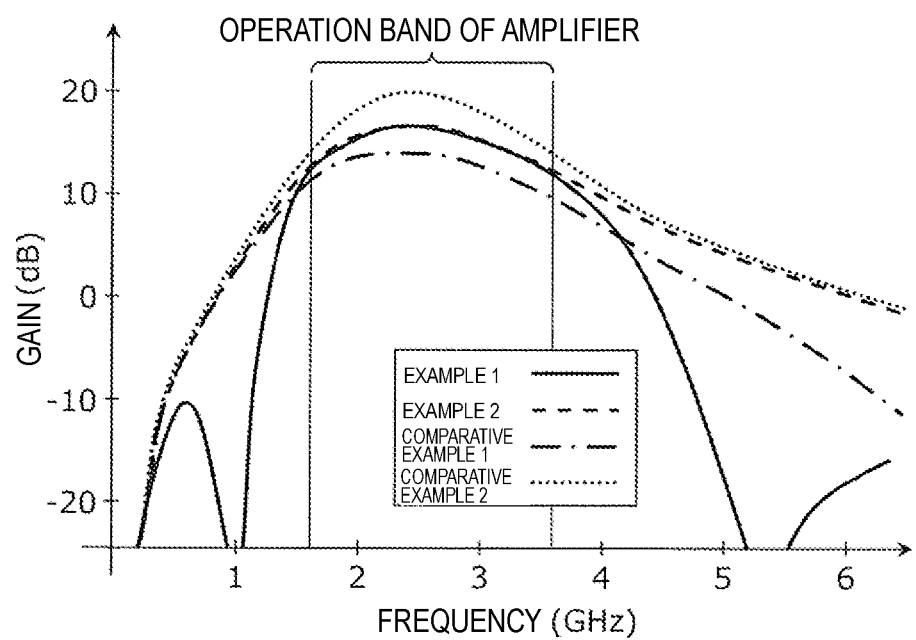
FIG. 6 is a graph illustrating an example of gain of amplifying apparatuses according to Examples as compared to comparative examples.

FIG. 6 is a graph illustrating an example of gain of each of the respective amplifying apparatuses in Examples 1 and 2, and Comparative examples 1 and 2.

As illustrated in FIG. 6, it is confirmed that, in Comparative example 2, larger gain is obtained as compared to Comparative example 1 and Examples 1 and 2, but linearity (for example, a value of a third order input intercept point IIP3), is inferior to those in Comparative example 1 and Examples 1 and (not illustrated). In order to improve the linearity, in each of Comparative example 1, and Examples 1 and 2, negative feedback due to magnetic coupling between the inductors L1 and L2 is provided. By providing the negative feedback, the gain decreases to a certain extent, and the linearity is improved.

In Comparative example 1, an amount of decrease in gain from Comparative example 2 is larger as compared to Examples 1 and 2. It is conceivable that this is due to the following reasons.

When the negative feedback by the magnetic coupling between the inductors L1 and L2 is provided, parasitic capacitance $C_P$ occurs between the gate and the source of the transistor T1, caused by the electric coupling occurring between the inductors L1 and L2, and thus an equivalent cutoff frequency of the transistor T1 decreases.

An equivalent cutoff frequency $f_T'$ of the transistor T1 when the parasitic capacitance $C_P$ is present is expressed by Equation 1.

$$f_T' = \frac{f_T}{1 + \frac{C_P}{(C_{GS} + C_{GD})}} \qquad \text{(Equation 1)}$$

Here, $f_T$ is an original (that is, in a case without the parasitic capacitance $C_P$) cutoff frequency of the transistor T1. $C_{GS}$ is gate-to-source capacitance of the transistor T1, and $C_{GD}$ is gate-to-drain capacitance of the transistor T1.

From Equation 1, as the parasitic capacitance $C_P$ increases, the equivalent cutoff frequency $f_T'$ becomes smaller than the original cutoff frequency $f_T$. For example, even when the parasitic capacitance $C_P$ is comparable to a sum of the gate-to-source capacitance $C_{GS}$ and the gate-to-drain capacitance $C_{GD}$, the equivalent cutoff frequency $f_T'$ drops to about half the original cutoff frequency $f_T$. As a result, surplus gain to be utilized for the negative feedback also significantly decreases.

In Comparative example 1, since the inductors L1 and L2 are arranged so as to overlap each other, larger electric coupling is likely to occur between the inductors L1 and L2 as compared to Examples 1 and 2. Thus, it is conceivable that the equivalent cutoff frequency $f_T'$ decreases and the gain decreases further significantly, due to the occurrence of the larger parasitic capacitance $C_P$ as compared to Examples 1 and 2.

In addition, when the parasitic capacitance $C_P$ is present, an inductance value $L_1'$ required for the inductor L1 to achieve both noise match and gain match is expressed by Equation 2.

$$L_1' = L_1\left(1 + \frac{C_P}{(C_{GS} + C_{GD})}\right) \quad \text{(Equation 2)}$$

Here, $L_1$ is an original inductance value required for the inductor L1 to achieve both the noise match and the gain match, when the parasitic capacitance $C_P$ is not present.

From Equation 2, as the parasitic capacitance $C_P$ increases, the inductance value $L_1'$ required for the inductor L1 becomes larger than the original inductance value $L_1$. For example, even when the parasitic capacitance $C_P$ is comparable to the sum of the gate-to-source capacitance $C_{GS}$ and the gate-to-drain capacitance $C_{SD}$, the inductance value $L_1'$ required for the inductor L1 increases to about twice the original inductance value $L_1$. As a result, the inductor L1 is increased in size. It is also concerned that the increase in size of the inductor L1 further increases the parasitic capacitance $C_P$ that is unwanted.

Thus, in Examples 1 and 2, the inductors L1 and L2 are arranged so as not to overlap each other. In other words, the inductors L1 and L2 are arranged so as to be lateral to each other.

Accordingly, even when somewhat large magnetic coupling is provided between the inductors L1 and L2, the electric coupling between the inductors L1 and L2 is less likely to be large, and thus the parasitic capacitance $C_P$ occurring between the gate and the source of the transistor T1 is suppressed. As a result, the equivalent cutoff frequency $f_T'$ is less likely to decrease, and a decrease in gain is suppressed to be small. An amount by which the decrease in gain is suppressed can be applied to the negative feedback, to further improve the linearity.

As illustrated in FIG. 6, in the operation band of the amplifier, the gain in both Examples 1 and 2 is larger than the gain in Comparative example 1. That is, it can be confirmed from FIG. 6 that the decrease in the gain in Examples 1 and 2 from Comparative example 2 is suppressed to be small, as compared to the decrease in the gain in Comparative example 1 from Comparative example 2.

In particular, in Example 1, the resonance circuits 20 and 30 ensure the large attenuation outside the operation band of the amplifier (notch seen outside the operation band of the amplifier in FIG. 6). Accordingly, in Example 1, frequency selectivity of gain is improved, as compared to Example 2.

The resonance circuits 20 and 30 each attenuate unwanted waves outside the operation band, by forming an attenuation pole on a bandpass characteristic of the amplifier, outside the operation band of the amplifier. Since the resonance circuits 20 and 30 are constituted by a small number of circuit elements, that is, the inductors L2 and L3 and the capacitors C1 and C2, it is possible to resolve the insufficient attenuation outside the operation band, without greatly impairing other electrical characteristics of the amplifying apparatus 1.

Note that, a distance between the respective outermost wiring conductors of the inductors L1 and L3 is also designed such that the inductors L1 and L3 are magnetically coupled to each other with magnitude suitable for forming the desired negative feedback. Since the inductors L1 and L3 are arranged so as not to overlap each other, even when the inductors L1 and L3 are brought close to each other, and somewhat large magnetic coupling is provided between the inductors L1 and L3, electric coupling is unlikely to be large, thus the parasitic capacitance $C_P$ occurring between the gate and the source of the transistor T1 is suppressed. As a result, the equivalent cutoff frequency $f_T'$ is less likely to decrease, and a decrease in gain is suppressed to be small. An amount by which the decrease in gain is suppressed can be applied to the negative feedback, to further improve the linearity.

The details of the layout illustrated in FIG. 3 will be supplemented below.

As illustrated in FIG. 3, an inner peripheral end of the inductor L1 may be connected to the source of the transistor T1, and an outer peripheral end of the inductor L1 may be connected to the ground.

Connecting the outer peripheral end of the inductor L1 to the ground decreases an electric field occurring in an outer peripheral portion of the inductor L1, and thus the occurrence of the parasitic capacitance $C_P$ due to the unwanted electric coupling between the inductor L1 and the inductor L2 is suppressed.

Further, an inner peripheral end of the inductor L2 may be connected to the gate of the transistor T1, and an outer peripheral end of the inductor L2 may be connected to the input end RFin.

Connecting the outer peripheral end of the inductor L2 to the input end RFin decreases an electric field occurring in an outer peripheral portion of the inductor L2, and thus the occurrence of the parasitic capacitance $C_P$ due to the unwanted electric coupling between the inductor L2 and the inductor L1 is suppressed.

Further, an inner peripheral end of the inductor L3 may be connected to the gate of the transistor T1, and an outer peripheral end of the inductor L3 may be connected to the ground.

Connecting the outer peripheral end of the inductor L3 to the ground decreases an electric field occurring in an outer peripheral portion of the inductor L3, and thus the occurrence of the parasitic capacitance $C_P$ due to the unwanted electric coupling between the inductor L3 and the inductor L1 is suppressed.

Further, forming each of the inductors L1, L2, and L3 as a spiral inductor facilitates the incorporation into an integrated circuit device. Further, arranging the inductors L1, L2, and L3 on substantially the same plane makes it possible to decrease the overlap of the projected areas, decrease the electric coupling, and is favor of the securement of the gain and miniaturization for the amplifier.

Embodiment 2

An amplifying apparatus according to Embodiment 2 will be described with reference to an example of an amplifying apparatus having negative feedback formed by the magnetic coupling between the inductors.

Figure 7:
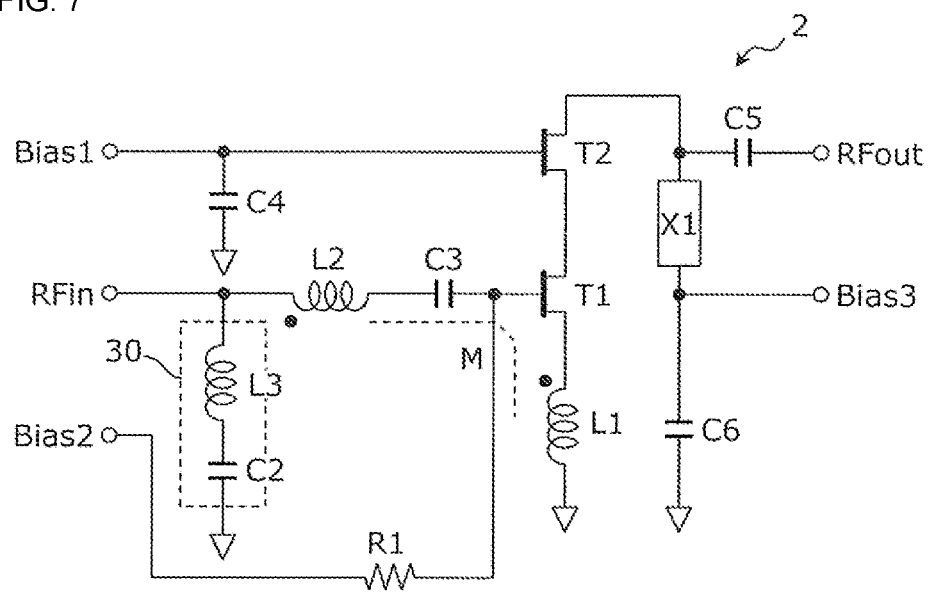
FIG. 7 is a circuit diagram illustrating an example of a circuit configuration of an amplifying apparatus according to Embodiment 2.

FIG. 7 is a circuit diagram illustrating an example of a circuit configuration of an amplifying apparatus according to Embodiment 2. As illustrated in FIG. 7, an amplifying apparatus 2 is different from the amplifying apparatus 1 in FIG. 1 in that the capacitor C1 is removed. The amplifying apparatus 2 does not include the resonance circuit 20 in the amplifying apparatus 1.

Figure 8:
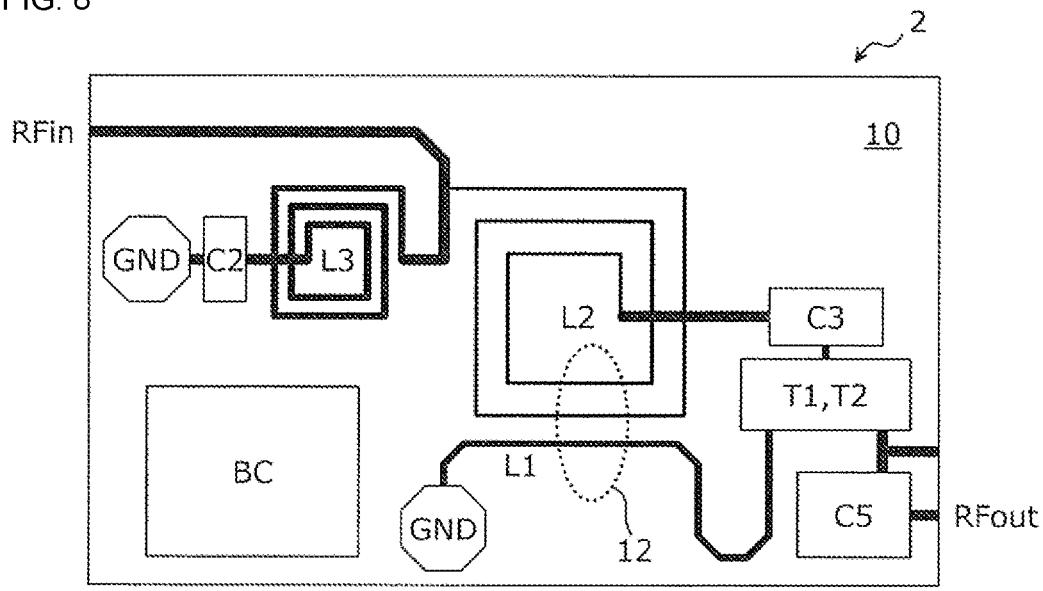
FIG. 8 is a layout diagram illustrating an example of an arrangement of main circuit elements of the amplifying apparatus according to Embodiment 2.

FIG. 8 is a layout diagram illustrating an example of an arrangement of main circuit elements in the amplifying apparatus 2. In FIG. 8, an arrangement of circuit elements seen in a plan view of the substrate 10 is illustrated, while the same reference signs as those used in FIG. 7 are assigned. Some of the circuit elements illustrated in FIG. 7 are omitted in FIG. 8. Materials and configurations of the substrate 10 and various circuit elements are the same as those in the description in FIG. 3, and thus, the detailed description thereof will be omitted.

A layout in FIG. 8 is different from the layout of FIG. 3 in a shape of the inductor L1. The inductor L1 in the amplifier circuit 2 is formed of a substantially linear wiring conductor. A shape of the wiring conductor may be a shape mainly composed of a straight line, or may be bent, but a shape continuously spiraled one or more times in a fixed direction is excluded. In the example illustrated in FIG. 8, the inductor L1 is formed of a bent and substantially linear (not spiral-shaped) wiring conductor.

With the circuit configuration (FIG. 7) and the layout of the amplifying apparatus 2, the same effect as the effect described with respect to the amplifying apparatus 1 (Examples 1 and 2) according to Embodiment 1 can be also obtained. That is, also in the amplifying apparatus 2, the inductors L1 and L2 are arranged so as not to overlap each other. In other words, the inductors L1 and L2 are arranged so as to be lateral to each other.

Accordingly, even when somewhat large magnetic coupling is provided between the inductors L1 and L2, the electric coupling between the inductors L1 and L2 is less likely to be large, and thus the parasitic capacitance $C_P$ occurring between the gate and the source of the transistor T1 is suppressed. As a result, the equivalent cutoff frequency $f_T'$ of the transistor T1 is less likely to decrease, and a decrease in gain is suppressed to be small. An amount by which the decrease in gain is suppressed can be applied to the negative feedback, to further improve the linearity.

As described above, also with the amplifying apparatus 2, an amplifying apparatus can be obtained in which both the gain and the linearity can also be easily achieved, similarly to the amplifying apparatus 1.

The details of the layout illustrated in FIG. 8 will be supplemented below.

The inductor L1 has a first portion (a right side portion in FIG. 8) located on a source side of the transistor T1, and a second portion (a left side portion in FIG. 8) located on a ground side. The inductor L2 is arranged closer to the second portion (the left side portion in FIG. 8) of the inductor L1, than the first portion (the right side portion in FIG. 8) of the inductor L1 (a dotted circle 12 in FIG. 8).

By making a main surface of the inductor L1 parallel to a surface on which the inductor L2 that is a spiral inductor is wound, an area of an opposing surface can be minimized, and the occurrence of the parasitic capacitance $C_P$ that is unwanted caused by the unwanted electric coupling can be minimized.

The second portion located on the ground side of the inductor L1, and the inductor L2 may face each other.

Accordingly, the second portion of the inductor L1 for which an electric field occurring is small due to the location on the ground side, and the inductor L2 face each other, thus the occurrence of the parasitic capacitance $C_P$ due to the unwanted electric coupling with the inductor L2 is suppressed.

Further, an inner peripheral end of the inductor L2 may be connected to the gate of the transistor T1, and an outer peripheral end of the inductor L2 may be connected to the input end RFin.

Connecting the outer peripheral end of the inductor L2 to the ground decreases an electric field occurring in an outer peripheral portion of the inductor L2, and thus the occurrence of the parasitic capacitance $C_P$ due to the unwanted electric coupling with the inductor L1 is suppressed.

Embodiment 3

An amplifying apparatus according to Embodiment 3 will be described with reference to an example of an amplifying apparatus having negative feedback formed by the magnetic coupling between the inductors.

Figure 9:
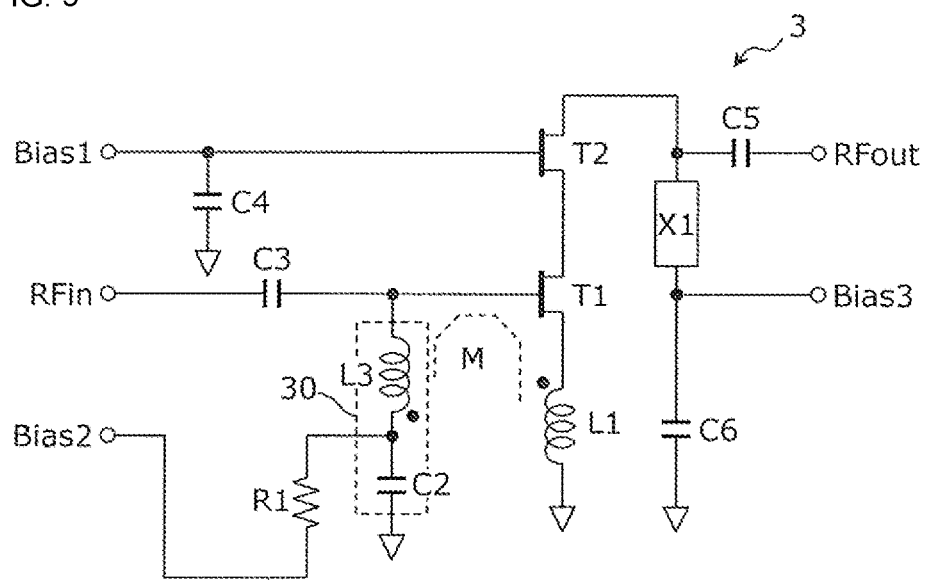
FIG. 9 is a circuit diagram illustrating an example of a circuit configuration of an amplifying apparatus according to Embodiment 3.

FIG. 9 is a circuit diagram illustrating an example of a circuit configuration of an amplifying apparatus according to Embodiment 3. As illustrated in FIG. 9, an amplifying apparatus 3 is different from the amplifying apparatus 1 in FIG. 1 in that the inductor L2 and the capacitor C1 are removed, the resistor R1 is connected between a node between the inductor L3 and the capacitor C2, and the second bias end Bias2, and the arrangement of the capacitor C3 is changed. The amplifying apparatus 3 does not include the resonance circuit 20 in the amplifying apparatus 1.

In the amplifying apparatus 3, the inductor L1 and the inductor L3 are magnetically coupled to each other so as to form negative feedback. In the amplifying apparatus 3, the linearity of an amplifier is improved by the negative feedback due to the magnetic coupling between the inductor L1 and the inductor L3.

Figure 10:
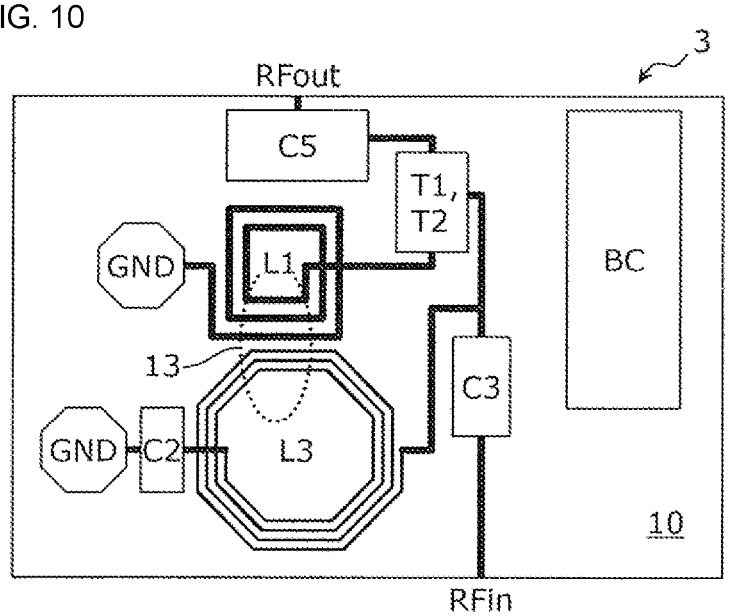
FIG. 10 is a layout diagram illustrating an example of an arrangement of main circuit elements of the amplifying apparatus according to Embodiment 3.

FIG. 10 is a layout diagram illustrating an example of an arrangement of main circuit elements in the amplifying apparatus 3. In FIG. 10, an arrangement of circuit elements seen in a plan view of the substrate 10 is illustrated, while the same reference signs as those used in FIG. 9 are assigned. Some of the circuit elements illustrated in FIG. 9 are omitted in FIG. 10. Materials and configurations of the substrate 10 and various circuit elements are the same as those in the description in FIG. 3, and thus, the detailed description thereof will be omitted.

In the example in FIG. 10, when the substrate 10 is viewed in a plan view, the inductors L1 and L3 do not overlap each other. In other words, the inductors L1 and L3 are arranged so as to be lateral to each other.

A distance between the respective outermost wiring conductors of the inductors L1 and L3 is designed such that the inductors L1 and L3 are magnetically coupled to each other with magnitude suitable for forming the desired negative feedback (a dotted circle 13 in FIG. 10). Since the inductors L1 and L3 are arranged so as not to overlap each other, even when the inductors L1 and L3 are brought close to each other, and somewhat large magnetic coupling is provided between the inductors L1 and L3, electric coupling is unlikely to be large, thus the parasitic capacitance $C_P$ occurring between the gate and the source of the transistor T1 is suppressed. As a result, the equivalent cutoff frequency $f_T'$ is less likely to decrease, and a decrease in gain is suppressed to be small. An amount by which the decrease in gain is suppressed can be applied to the negative feedback, to further improve the linearity.

As described above, also with the amplifying apparatus 3 that does not include the inductor L2, an amplifying apparatus can be obtained in which both gain and linearity can be easily achieved, similarly to the amplifying apparatuses 1 and 2.

According to the above-described amplifying apparatus, even when somewhat large magnetic coupling is provided between the first inductor and the second inductor, electric coupling is less likely to be large, and thus the parasitic capacitance occurring between the gate and the source of the transistor is suppressed. Accordingly, since the equivalent cutoff frequency of the transistor is less likely to decrease, a decrease in gain of the amplifier is suppressed to be small, and at the same time, the linearity of the amplifier can be improved by the negative feedback with the magnetic coupling between the first inductor and the second inductor interposed therebetween. As a result, an amplifying apparatus capable of easily achieving both gain and linearity can be obtained.

The amplifying apparatuses according to the embodiments of the present disclosure have been described above, but the present disclosure is not limited to the individual embodiments. Those obtained by applying various modifications that can be conceived by those skilled in the art to the present embodiments, and modes that are constructed by combining the constituent elements in the different embodiments, may also be included within the scope of one or more aspects of the present disclosure, without departing from the spirit of the present disclosure.

The present disclosure is widely applicable to various types of communication devices as an amplifying apparatus.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplifying apparatus, comprising:
   a transistor arranged on a substrate and constituting an amplifier;
   an input terminal for inputting a high-frequency signal to the amplifier;
   an output terminal for outputting the high-frequency signal amplified by the amplifier;
   a first inductor provided in or on the substrate and connected between a source of the transistor and a ground; and
   a second inductor provided in or on the substrate and connected between a gate of the transistor and the input terminal, wherein
   when the substrate is viewed in a plan view, the first inductor and the second inductor do not overlap each other, and in a region surrounded by a wiring conductor located at an outermost periphery of the first or second inductor, there is no wiring conductor constituting another inductor.

2. The amplifying apparatus according to claim 1, wherein
   the first inductor and the second inductor are magnetically coupled to each other.

3. The amplifying apparatus according to claim 1, wherein
   at least one of the first inductor and the second inductor is substantially spiral-shaped.

4. The amplifying apparatus according to claim 3, wherein
   the first inductor is substantially spiral-shaped, and
   an inner peripheral end of the first inductor is connected to the source of the transistor and an outer peripheral end of the first inductor is connected to the ground.

5. The amplifying apparatus according to claim 3, wherein
   the second inductor is substantially spiral-shaped, and
   an inner peripheral end of the second inductor is connected to the gate of the transistor and an outer peripheral end of the second inductor is connected to the input terminal.

6. The amplifying apparatus according to claim 1, further comprising:
   a third inductor provided in or on the substrate and connected between the gate of the transistor and the ground, wherein
   when the substrate is viewed in a plan view, the first inductor and the third inductor do not overlap each other.

7. The amplifying apparatus according to claim 6, wherein
   the first inductor and the third inductor are magnetically coupled to each other.

8. The amplifying apparatus according to claim 6, wherein
   the third inductor is substantially spiral-shaped.

9. The amplifying apparatus according to claim 8, wherein
   an inner peripheral end of the third inductor is connected to the gate of the transistor and an outer peripheral end of the third inductor is connected to the ground.

10. The amplifying apparatus according to claim 1, further comprising:
    a first capacitor connected in parallel to the second inductor.

11. The amplifying apparatus according to claim 10, wherein
    a resonant frequency of a resonance circuit constituted by the second inductor and the first capacitor is outside a higher side of an operation frequency band of the amplifier constituted by the transistor.

12. The amplifying apparatus according to claim 6, further comprising:
    a second capacitor connected in series to the third inductor.

13. The amplifying apparatus according to claim 12, wherein
    a resonant frequency of a resonance circuit constituted by the third inductor and the second capacitor is outside a lower side of an operation frequency band of the amplifier constituted by the transistor.

14. The amplifying apparatus according to claim 2, wherein
    at least one of the first inductor and the second inductor is substantially spiral-shaped.

15. The amplifying apparatus according to claim 2, further comprising:
a third inductor provided in or on the substrate and connected between the gate of the transistor and the ground, wherein
when the substrate is viewed in a plan view, the first inductor and the third inductor do not overlap each other.

16. The amplifying apparatus according to claim 3, further comprising:
a third inductor provided in or on the substrate and connected between the gate of the transistor and the ground, wherein
when the substrate is viewed in a plan view, the first inductor and the third inductor do not overlap each other.

17. The amplifying apparatus according to claim 4, further comprising:
a third inductor provided in or on the substrate and connected between the gate of the transistor and the ground, wherein
when the substrate is viewed in a plan view, the first inductor and the third inductor do not overlap each other.

18. The amplifying apparatus according to claim 5, further comprising:
a third inductor provided in or on the substrate and connected between the gate of the transistor and the ground, wherein
when the substrate is viewed in a plan view, the first inductor and the third inductor do not overlap each other.

19. The amplifying apparatus according to claim 7, wherein
the third inductor is substantially spiral-shaped.

20. The amplifying apparatus according to claim 2, further comprising:
a first capacitor connected in parallel to the second inductor.

* * * * *

UNITED STATES PATENT AND TRADEMARK OFFICE
CERTIFICATE OF CORRECTION

PATENT NO. : 11,451,195 B2
APPLICATION NO. : 16/868842
DATED : September 20, 2022
INVENTOR(S) : Makoto Tabei Page 1 of 1

It is certified that error appears in the above-identified patent and that said Letters Patent is hereby corrected as shown below:

In the Specification

Column 6, Line 42, "Examples 1 and (not" should be -- Examples 1 and 2 (not --.

Column 7, Line 41, "$C_{SD}$" should be -- $C_{GD}$ --.

Signed and Sealed this
Twenty-fifth Day of July, 2023

Katherine Kelly Vidal
*Director of the United States Patent and Trademark Office*